(12) United States Patent
Lin et al.

(10) Patent No.: US 6,297,496 B1
(45) Date of Patent: Oct. 2, 2001

(54) PHOTODETECTORS WITH PASSIVE THERMAL RADIATION CONTROL

(75) Inventors: Shawn-Yu Lin; James G. Fleming; Brian W. Dodson, all of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/447,535

(22) Filed: Nov. 23, 1999

(51) Int. Cl.$^7$ ................................................ H01L 31/00
(52) U.S. Cl. ................................. 250/214.1; 250/216
(58) Field of Search .......................... 250/214.1, 214 R, 250/214 LA, 216, 208.1, 226, 225; 257/432–436

(56) References Cited

U.S. PATENT DOCUMENTS 4,695,859 * 9/1987 Guha et al. ............................ 257/80

* cited by examiner

*Primary Examiner*—Que T. Le
(74) *Attorney, Agent, or Firm*—Brian W. Dodson

(57) ABSTRACT

A new class of photodetectors which include means for passive shielding against undesired thermal radiation is disclosed. Such devices can substitute in applications currently requiring cooled optical sensors, such as IR detection and imaging. This description is included for purposes of searching, and is not intended to limit or otherwise influence the interpretation of the present invention.

12 Claims, 5 Drawing Sheets

PHOTODETECTORS WITH PASSIVE THERMAL RADIATION CONTROL

This invention was made with Government support under Contract DE-AC04-94DP85000 awarded by the U.S. Department of Energy. The Government has certain rights in the invention.

BACKGROUND

The present invention relates generally to infrared photodetectors, and more specifically to a new class of photodetectors which comprise passive structures which reduce self-interference from thermal radiation from the device or its surroundings.

The thermal emissivity of a body characterizes the flux of thermal "blackbody" radiation emitted from the body's surfaces. The ability to passively detect and measure such thermal radiation, e.g., through the use of a photodetector, allows detection and analysis of objects at a distance. Such features as temperature and surface condition can be determined in many cases.

Considerable technological difficulties appear in the use of photodetectors sensitive to thermal radiation characteristic of normal environments (roughly 3 to 30 $\mu$m in wavelength). The surfaces of the photodetector and its housing must be cooled well below room temperature, or the thermal radiation emitted by these surfaces will compromise the limiting sensitivity of the photodetector.

SUMMARY OF THE INVENTION

The present invention relates to photodetectors incorporating internal surfaces coated with new thermal emission control media. This allows uncooled operation while retaining high sensitivity to external sources of thermal radiation. The new thermal emission control media comprise photonic media.

DEFINITIONS

Photonic Medium—A material in which spatial variation of dielectric constant results in significant photonic structure within the photon density of states within said material. Unless otherwise stated, the photonic structure appears in all three dimensions.

Photonic Structure—Photonic structure refers to marked increase or decrease in the photon density of states in a photonic medium in a limited range or ranges of photon energies.

Photonic Bandgap—A type of photonic structure in a photonic medium which reduces the photon density of states essentially to zero for all polarizations and orientations within a range of energies. At times the mean energy and/or the width of the range of energies will be called the bandgap—the usage will be clear from the context. Unless otherwise stated, a photonic bandgap is a three-dimensional photonic bandgap.

Partial Photonic Bandgap—A type of photonic structure in a photonic medium which reduces the photon density of states within a range of energies, but where some photons, possibly restricted to specific directions or polarizations, are permitted at every photon energy. Unless otherwise stated, a partial photonic bandgap is a three-dimensional partial photonic bandgap.

Particles of Photonic Medium—Particles which consist essentially of a photonic medium are understood to have dimensions sufficient that they exhibit the desired photonic structure. Typically this means that the particles are significantly larger than the vacuum wavelength of the bandgap.

DETAILED DESCRIPTION

Thermal radiation control media based on the unusual properties of photonic media have been described and claimed by Applicants in copending U.S. patent application Ser. No. 09/441,221, filed on Nov. 15, 1999, which is hereby included in its entirety. These media will be briefly discussed below, and then their application to photodetectors will be described.

Photonic media are materials having a spatially varying dielectric constant. This spatial variation is usually periodic, and for the present applications is generally in three-dimensions, but these conditions are not necessary. The materials of which the photonic media are composed generally exhibit low loss due to absorption in the range of photon energies in which they are intended to be used.

Figure 1:
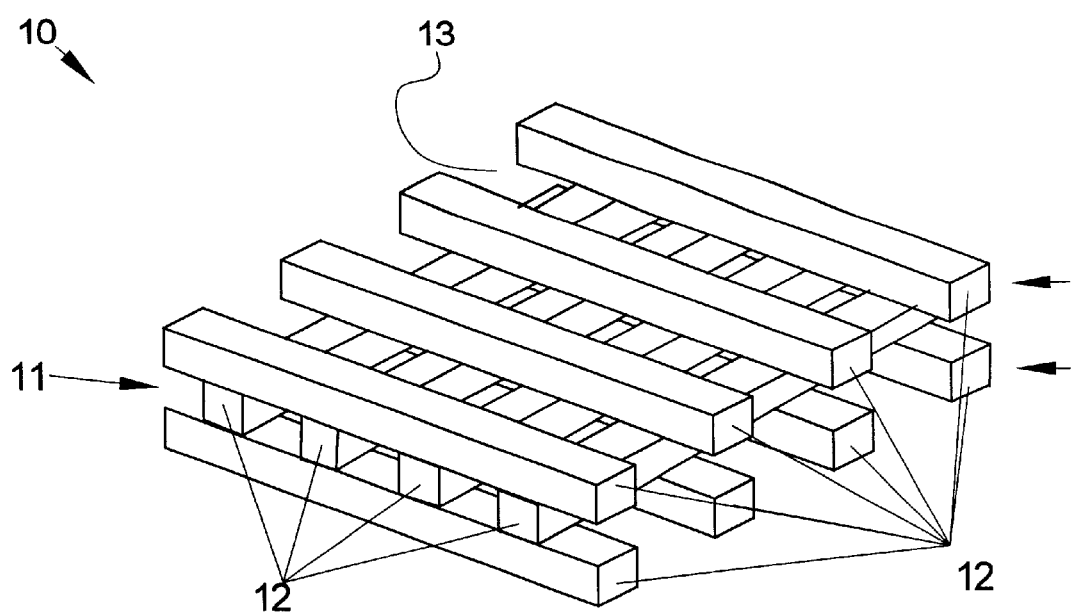
FIG. 1 shows a schematic illustration of a three-dimensional "woodpile" type of periodic dielectric structure typical of photonic media.

A typical practical photonic medium is shown in FIG. 1. Here is shown a "woodpile" photonic medium 10, comprising an alternating pile of layers 11, each layer 11 comprising an evenly spaced row of parallel strips 12 of material with a first dielectric constant. Alternate layers are rotated by 90 degrees relative to the previous layer. The spaces between the strips 12 are filled by a material 13 having a second dielectric constant. For simplicity as well as high dielectric contrast, material 13 is often simply air.

As light (here meaning electromagnetic radiation in the range where the photonic medium is intended to be applied) passes through the photonic medium, it experiences multiple scattering off the variations in the dielectric constant. It was discovered in the early 1980's that the spacing and magnitude (or dielectric contrast) of a periodic spatially-varying dielectric constant could be such that the resulting photonic medium would exhibit a photonic bandgap.

A photonic bandgap is a range of energies within which any propagating electromagnetic mode undergoes destructive interference. The result is that photons within this range of energies cannot propagate in the photonic medium, and hence are totally reflected therefrom. The physical theory and mathematics describing this effect is analogous to that describing the formation of a bandgap in the electronic structure of a semiconductor.

The question of what becomes of the forbidden propagating photon states is of fundamental interest, and has been a subject of much conjecture and little evidence since the discovery of photonic media. However, Applicants now have the first experimental evidence that the forbidden states vanish.

Figure 2:
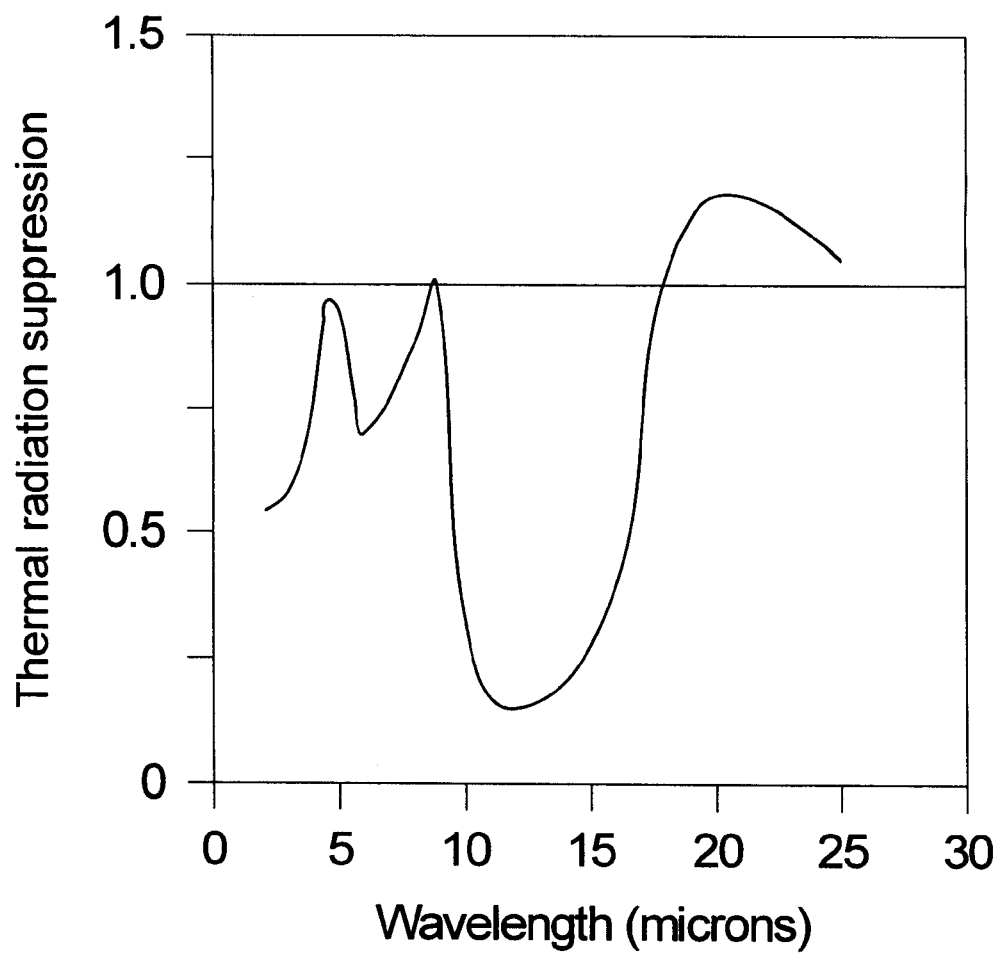
FIG. 2 shows an experimental graph of thermal radiation suppression as a function of photon wavelength for a 5 layer photonic lattice.

FIG. 2 shows a recent measurement by Applicants of the thermal radiation emitted by a silicon woodpile type photonic lattice, 5 layers in thickness, with a complete photonic bandgap in the 10–16 μm range. The figure shows the thermal radiation flux as a function of photon vacuum wavelength. The thermal radiation flux is severely reduced in the region of the photonic bandgap. This establishes that the thermal emissivity of photonic media is reduced in a manner consistent with theory.

Thermal radiation can be blocked by introducing a layer of photonic media between a body and an observer. However, a monolithic layer of photonic medium is difficult to apply over a large irregular object, and tends to be rather fragile. As the photonic medium must be the outermost layer (or nearly so) of the body being shielded, protecting the photonic medium from damage can be difficult.

Figure 3:
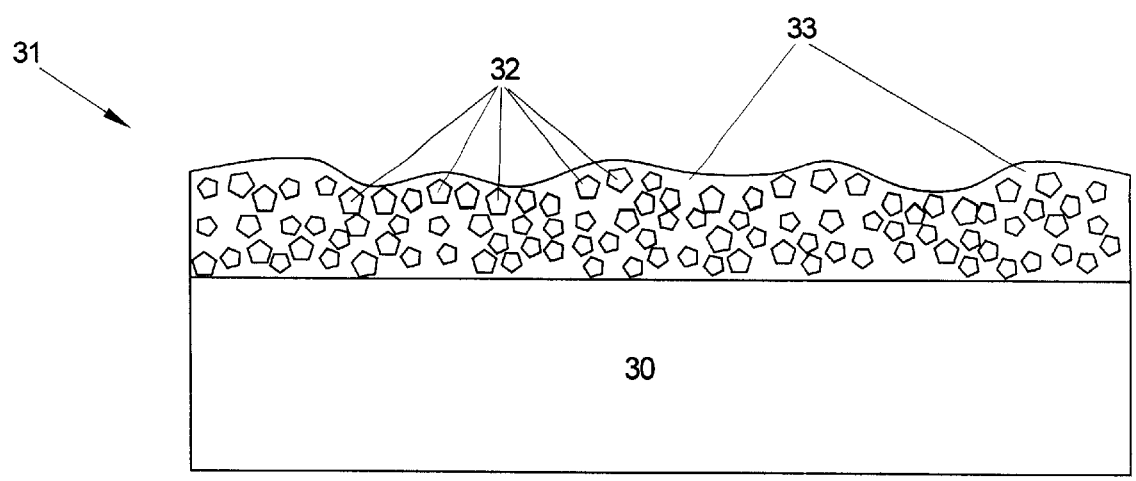
FIG. 3 shows schematically the structure of a photonic paint after the present invention.

Applicants teach use of a photonic paint for thermal radiation control. FIG. 3 shows a schematic illustration of the typical components which make up a photonic paint. The illustration shows a substrate 30 covered by a layer 31 of photonic paint. The photonic paint comprises powdered photonic media 32 suspended in a binding medium 33. The powdered photonic media 32 must have particle size large enough that individual powder particles exhibit the desired photonic structure—typical powder dimensions will be somewhat greater than the vacuum wavelength characterizing the photonic structure of the medium from which the powder is obtained.

The proportion of the powdered photonic media by volume should be large enough that the thermal emission of the painted substrate is dominated by that of the photonic medium, and not by that of the binding medium or of the substrate surface. The optics governing the performance of photonic paint is complex enough that in any given case this proportion must be optimized by experiment. However, the issues which go into making an initial estimate are quite general, and have been discussed in Applicant's earlier patent application which was included earlier by reference.

Figure 4:
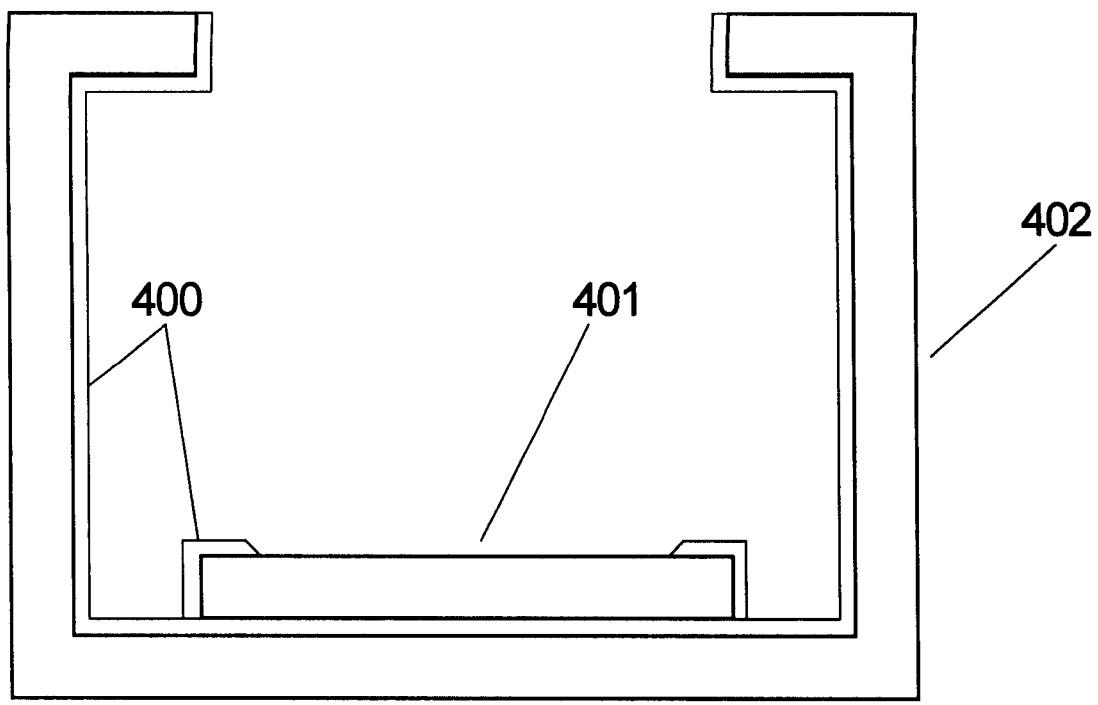
FIG. 4 shows a broadband photodetector with thermal emission control medium.

Application of thermal emission control materials comprising photonic materials can allow uncooled operation of a photodetector while avoiding undue interference by thermal radiation from surfaces of the photodetector and its housing. One approach is shown in FIG. 4. This shows a photodetector 401 and mount 402, to whose internal surfaces are added a coating of a thermal emission control medium 400. Such coating must be applied to all surfaces in direct or reflected line-of-sight of the light-sensitive area on the photodetector.

Thermal emission control medium 400 is designed so that it has a photonic bandgap (or nearly so) in the wavelength range to which the sensor is sensitive. This eliminates locally generated thermal radiation, so that the infrared radiation to which the sensor is exposed comes from the external target.

Substantial benefit can be obtained by substitution of a thermal emission control medium for a refrigerating system. The ratio R between the thermal radiation flux from a normal surface at temperature $T_o$ and that same surface at a cooler temperature T is approximately $$\exp [h\nu/kT_o] \exp [-h\nu/kT]$$

To give some perspective to this result, if the medium displays a factor of 100 less background thermal emission in the sensitivity range of the sensor, a level of performance which should be easy to attain, the equivalent shroud and system temperature is about 30 K. Even using the simple and rather crude photonic medium used in Applicants demonstration above, the equivalent shroud and system temperature is about half room temperature, near 165 K. Clearly, thermal emission control media comprising photonic media can make a tremendous difference in the sensitivity of an infrared sensor.

A second area of application addresses a situation in which a very narrow range of wavelengths is to be detected, while the photodetector is sensitive to a much wider range of wavelengths.

It is often beneficial to restrict the range of wavelengths which can reach the sensor, e.g., to avoid interference from unwanted signals. A filter can provide such restriction, but the photodetector is now surrounded in all directions by surfaces which are quite efficiently emitting thermal radiation in the range of sensitivity of the sensor.

Figure 5:
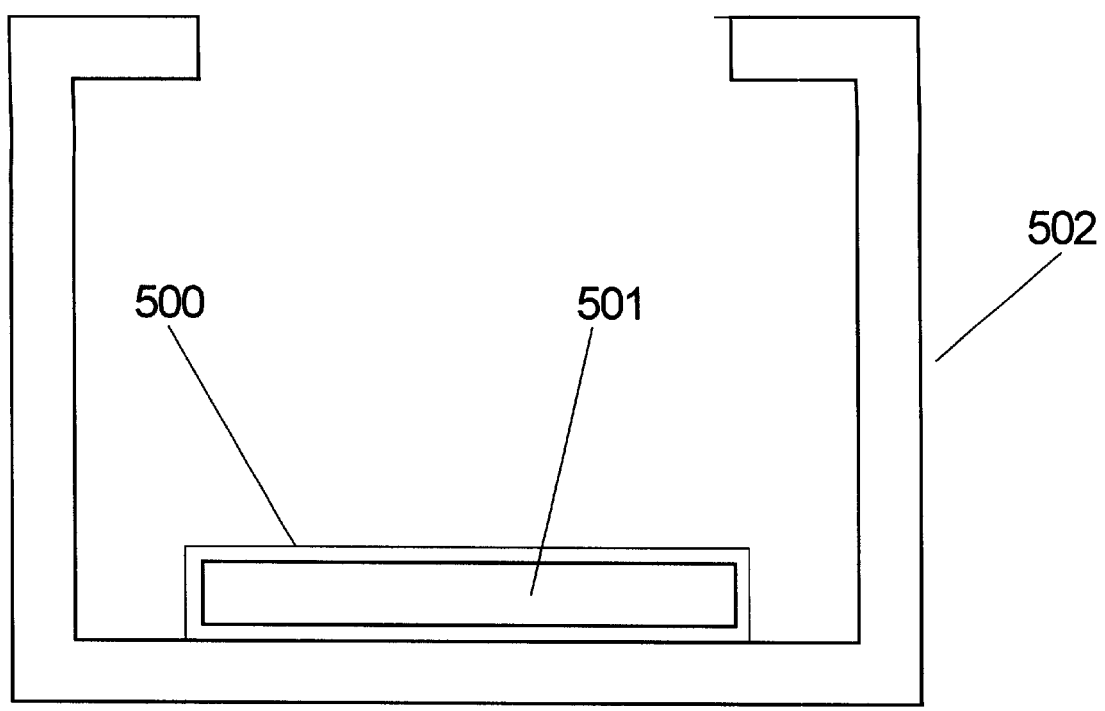
FIG. 5 shows a narrowband photodetector with thermal emission control medium.

In this situation, proper use of the instant invention results in an elegant solution to this problem. As shown in FIG. 5, it is only necessary to envelop the sensitive area of the sensor 501 with a thermal emission control medium including a photonic material which has both a photonic bandgap (complete or nearly so) covering the sensitivity band of the sensor, and also a defect structure tailored to provide defect states within the bandgap which allow light to travel through the medium at wavelengths in a narrow band surrounding the expected signal. This layer will be called thermal emission filter 500. Such defect states have been demonstrated, and are reasonably well understood both theoretically and experimentally.

Now, from the viewpoint of the sensor, only a tiny portion of the externally generated thermal radiation (perhaps a part in a thousand) is transmitted through the thermal emission filter 500. Because the thermal emission filter has a photonic bandgap, its thermal radiation in the wide range of wavelengths will be essentially zero. With such techniques the random thermal radiation background can be reduced by factors on the order of 1000. Note that in this instance coating the inside of mount 502 is not necessary.

The examples and implementations described above are intended to illustrate various aspects of the present invention. The scope of the invention is set by the claims interpreted in view of the specification.

What is claimed is:

1. A thermal radiation shielded photodetector, comprising:
    a) a photosensor sensitive to a band of photon energies; and,
    b) a coating upon said photosensor comprising a photonic medium having a photonic structure extending over said band of photon energies, including a narrow defect-mediated passband.

2. The photodetector of claim 1, wherein said photonic structure includes a complete photonic bandgap over said band of photon energies save where modified by defects.

3. The photodetector of claim 1, wherein said defect-mediated passband is limited to photons having said desired photon energy and a restricted set of spatial orientations.

4. The photodetector of claim 1, wherein said defect-mediated passband is limited to photons having said desired photon energy and a particular polarization.

5. The photodetector of claim 1, further comprising a refrigerator to cool the photosensor.

6. The photodetector of claim 1, wherein said defect-mediated passband is a multiple passband.

7. The photodetector of claim 1, wherein said coating comprises photonic paint.

8. A thermal radiation shielded photodetector, comprising:
    a) a photosensor sensitive to a band of photon energies;

b) an enclosure for said photosensor, comprising an optical aperture; and, c) a thermal radiation control coating comprising a photonic medium having low emissivity for said band of photon energies and covering substantially all areas of said enclosure having direct or reflected line of sight access to said photosensor.

9. The photodetector of claim 8, further comprising a refrigerator to cool the photosensor.

10. The photodetector of claim 8, further comprising a refrigerator to cool said enclosure.

11. The photodetector of claim 8, wherein said photonic medium exhibits a complete photonic bandgap over said band of photon energies.

12. The photodetector of claim 8, wherein said thermal radiation control coating comprises photonic paint.

* * * * *